(12) United States Patent
Barabash

(10) Patent No.: US 6,879,220 B2
(45) Date of Patent: Apr. 12, 2005

US006879220B2

(54) SWITCHLESS COMBINING OF MULTI-CARRIER COHERENT AND INCOHERENT CARRIERS

(75) Inventor: Darrell William Barabash, Grapevine, TX (US)

(73) Assignee: Nokia Corporation, Espoo (FI)

( * ) Notice: Subject to any disclaimer, the term of this patent is extended or adjusted under 35 U.S.C. 154(b) by 0 days.

(21) Appl. No.: 10/435,264

(22) Filed: May 12, 2003

(65) Prior Publication Data

US 2004/0235435 A1 Nov. 25, 2004

(51) Int. Cl.$^7$ ................................................. H03C 3/38
(52) U.S. Cl. ........................ 332/145; 455/326; 455/561; 455/327; 333/100; 333/109
(58) Field of Search ................................. 455/326, 561, 455/327; 333/100, 109; 332/145

(56) References Cited

U.S. PATENT DOCUMENTS 5,703,530 A * 12/1997 Sato et al.

* cited by examiner

Primary Examiner—Michael B. Shingleton
(74) Attorney, Agent, or Firm—Antonelli, Terry, Stout & Kraus, LLP (57) ABSTRACT

The invention is a combiner and a method for selectively combining modulated signals. The combiner includes a first modulator (12) with a selective input which receives at least one input signal and a first carrier signal and which outputs a first output modulated with the first carrier signal; a second modulator (14) with a selective input which receives at least one input signal and a second carrier signal and which outputs a second output modulated with the second carrier signal; means for combining (24') the first and second amplified output signals to provide a combined output; and wherein the first and second carrier signals are selectably coherent or incoherent with the selection of first and second coherent carrier signals causing the combined output to comprise a single carrier of higher power and the selection of incoherent carrier signals causing the combined output to comprise two distinguishable carriers of lower power.

55 Claims, 4 Drawing Sheets

SWITCHLESS COMBINING OF MULTI-CARRIER COHERENT AND INCOHERENT CARRIERS

BACKGROUND OF THE INVENTION

1. Field of the Invention

The present invention relates to selective combining of modulated signals.

2. Description of the Prior Art

Figure 1:
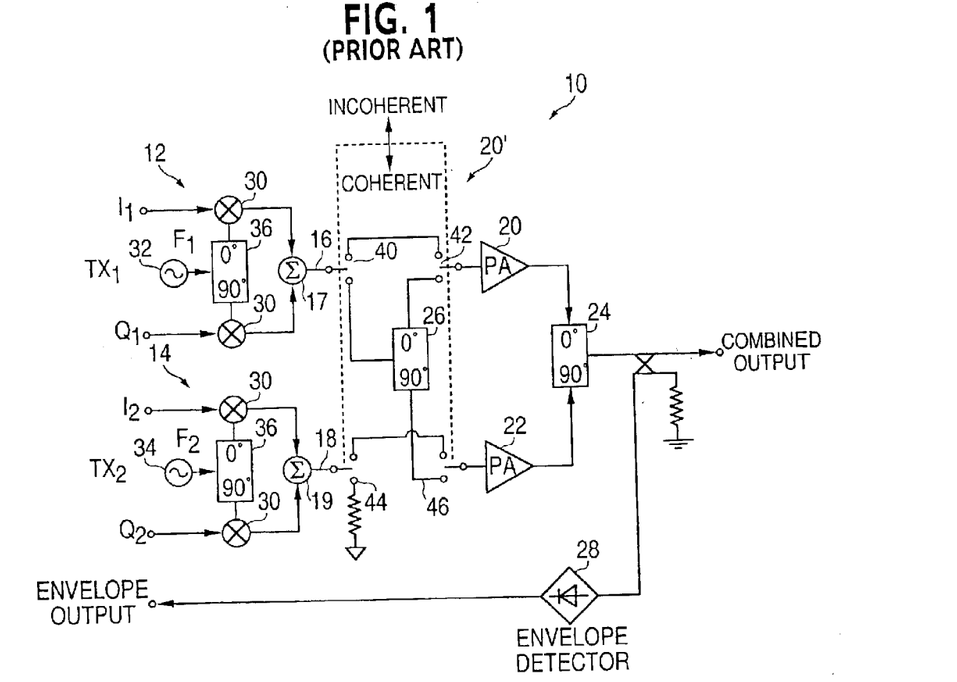
FIG. 1 illustrates a prior art combiner for selectively providing a combined output comprised of amplified modulated coherent signals or amplified modulated noncoherent signals.

FIG. 1 illustrates a prior art combiner 10 which has been used in base stations to selectively provide an output of a single modulated carrier of higher power output or an output comprising two distinguishable carriers of lower power from a pair of quadrature modulators 12 and 14. The quadrature modulators 12 and 14 provide respectively combined output signals 16 and 18 from summers 17 and 19 respectively as inputs to a switch based signal router 20'. The signal router 20' selectively permits the choosing of the combined output signals 16 and 18 being applied independently to power amplifiers 20 and 22 which are input to a quadrature splitter 24 or output signal 16 applied to quadrature splitter 26 and split into quadrature components and then applied to power amplifiers 20 and 22. The quadrature splitter 24 sums the outputs of power amplifiers 20 and 22. The position of switch 40 determines if the signals that arrive at quadrature splitter 24 are coherent or incoherent. As is known, a coherent output has a carrier therein derived from a single frequency source and an incoherent output has the carriers therein derived from unrelated frequency sources.

For incoherent operation, the switches 40, 42, 44 and 46 of the signal router 20' are switched to the upper position which provides a path of the signals 16 and 18 into the power amplifiers 20 and 22 so the signals are amplified and input to the quadrature splitter 24. The amplifier signal from power amplifier 20 applied to the 0° input of the quadrature splitter 24 is not phase shifted in the combined output of the quadrature splitter and the amplifier signal from the power amplifier 22 applied to the 90° input of the quadrature splitter is phase shifted approximately 90° in the combined output. The result is the combination of the two independent carriers with the two carriers still being completely distinguishable. Because the total combined power will need to remain the same, the power of the individual components is reduced.

For coherent operation the external switches 40, 42, 44 and 46 of the signal router 20' are switched to the lower position which grounds the output from the summer 19. The input signal 16 is applied to a quadrature splitter 26 which provides a 0° and 90° output. The output from the 90° input has a 90° phase shift relative to the 0° input and is applied to the power amplifier 20. The output from the 0° input is applied without a phase shift to the power amplifier 22. The outputs from the power amplifiers 20 and 22 are input to the 90° and 0° inputs of the quadrature modulator 24. A phase shift of approximately 90° is introduced in the combined output from the 90° input of the quadrature splitter 24 and substantially no phase shift is introduced in the combined output from the 0° input. The output from the quadrature modulator 24 is a single modulated carrier of higher power and has a combined amplified power equal to the sum of the power produced by amplifiers 20 and 22. An envelope detector 28 detects an envelope of the combined output for conventional monitoring of the combined output combiner.

The quadrature splitters 24 and 26 have a voltage transfer function as follows:

$$\text{hybrid\_90} := \begin{bmatrix} \frac{1}{2}\sqrt{2} \\ \frac{1}{2}j\sqrt{2} \end{bmatrix}$$

$$\text{hybrid\_90} := \begin{bmatrix} \frac{1}{2}\sqrt{2} \\ \frac{1}{2}j\sqrt{2} \end{bmatrix}$$

The quadrature modulators 12 and 14 operate as follows: The input signals $I_1$, $Q_1$ and $I_2$, $Q_2$ are respectively applied to different modulators 30. The quadrature modulators 12 and 14 shift the signals from the baseband input to a carrier which is modulated by the input signals. The incoherent carrier signals $F_1$ and F2 are provided by signal sources 32 and 34 which may be analog sinusoidal carriers or digital representations produced in a digital signal processor. The quadrature splitters 36 respectively provide an unshifted carrier and a 90° shifted carrier output to the modulators 30 which also have inputs of the aforementioned I and Q signals. As is understood, the quadrature modulators 12 and 14 each output modulated signals which are complex signals containing orthogonal I and Q components. If the modulated carriers are in the analog domain, the representation thereof may be by sine and cosine functions as discussed below.

While the quadrature modulators 12 and 14 have been described with an architecture for providing modulated analog signals, it should be understood that digital signal processors as quadrature modulators may be used.

The prior art has the disadvantage of requiring the quadrature splitter 26 and four switches 40–46 in order to obtain the requisite alignment of phase and frequency for both incoherent and coherent combining. This additional hardware adds cost, complexity, increases size and introduces power loss resultant from the physical components identified above and is external to the quadrature modulators.

SUMMARY OF THE INVENTION

The present invention is a combiner and a method for combining modulated signals. First and second carrier signals are chosen to effect coherent or a incoherent combining so as to respectively provide coherent operation producing a single carrier at increased power or to provide noncoherent operation producing two carriers each of reduced power in the combined output. Selection of the combined output to be produced from coherent or noncoherent carriers is dependent upon the choice of the input signals and the carrier. When incoherent operation is selected, output signals from quadrature modulators, which contain orthogonal components modulated respectively on incoherent carriers, are summed, amplified and combined to provide a combined output. The combining of the output signals may be performed without the introduction of any relative phase difference during the combining of the output signals from the power amplifiers or may be combined with a selective phase shift in the output signals from the power amplifiers which may be 90° or 180° or any other angle without limitation. When coherent operation is selected, at least one input signal to first and second quadrature modulators is driven to zero or applied from one of a pair of quadrature inputs normally input to one of the quadrature modulators to one of the inputs to another of the quadrature modulators without or with an inversion. The manipulation of input signals with or without inversion permits the amplified outputs from the quadrature modulators to be combined as a single modulated carrier of higher power by modulation with one of the two incoherent carriers conventionally used for incoherent operation.

Alternatively, coherent operation may be affected using the above-described first modulator which receives an input comprising a complex signal TX and a first carrier signal and which outputs a first output of the first carrier modulated with the complex signal TX and a second modulator which receives an input comprising a complex signal −90°·TX and a second carrier signal and which outputs a second output of the second carrier modulated with the complex signal −90°·TX, and the first and second power amplifiers and the output combiner discussed above. The above-described elements may be used as a modular building block to provide a combiner apparatus comprising a plurality of combiners with each of the plurality of combiners producing an output signal which is combined by an output combiner comprising a first input and a second input with one of the inputs being phase shifted by a phase shift of approximately 90° relative to another of the inputs to produce a combined output comprising a single carrier having a power equalling a sum of the power of the output of the plurality of combiners.

The present invention has substantial advantages over the prior art as described above with respect to FIG. 1. Manipulations of the at least one input signal to the first and second quadrature modulators are relatively easy to perform at baseband. The construction is less expensive since the signal router 20' of the prior art has been totally eliminated. The elimination of the signal router 20' makes the size smaller, requires less power consumption, eliminates one quadrature splitter and four switches, permits manipulation of phase and amplitude within the combiner since the signal router 20' has been totally eliminated. The modular construction permits coherent operation producing a combined output with a power equalling the sum of the output power of the individual modules A combiner for selectively combining modulated signals in accordance with the invention includes a first modulator with a selective input which receives at least one input signal and a first carrier signal and which outputs a first output of a modulated first carrier signal; a second modulator with a selective input which receives at least one input signal and a second carrier signal and which outputs a second output of a modulated second carrier signal; a first power amplifier coupled to the first output for providing a first amplified output signal; a second power amplifier coupled to the second output for providing a second amplified output signal; means for combining the first and second amplified output signals to provide a combined output; and wherein the first and second carrier signals are selectably coherent or incoherent with the selection of coherent first and second carrier signals causing the combined output to comprise a single modulated carrier of higher power and the selection of incoherent carrier signals causing the combined output to comprise two distinguishable carriers of lower power. The first modulator output may comprise first and second modulated output signals which are modulated with the first carrier signal with the first and second modulated output signals being orthogonal; the second modulator output may comprise third and fourth modulated output signals which are modulated with the second carrier with the third and fourth modulated output signals being orthogonal; and the first and second modulator carrier signals may be incoherent. The first modulator output may comprise first and second modulated output signals which are modulated with the first carrier signal with the first and second modulated output signals being orthogonal; the second modulator output may comprise third and fourth modulated output signals which are modulated with the second carrier with the third and fourth modulated output signals being orthogonal; and the first and second modulator carrier signals may be coherent. The third output signal may be identical to the second signal and the fourth output signal may be an inversion of the first signal. The means for combining may introduce a phase shift so that a relative phase of components of the combined output signal is shifted relative to a phase of the first and second amplified output signals input thereto. The phase shift may be approximately 0°, approximately 90° or approximately 180°. The combiner may be part of a multi-carrier transmitter or a base station transmitter. A transfer function of the quadrature splitter may comprise $$\text{hybrid\_90} := \begin{bmatrix} \frac{1}{2}\sqrt{2} \\ \frac{1}{2}j\sqrt{2} \end{bmatrix}$$

The first modulator output signal may comprise a first output signal; the second modulator output signal may comprise a second output signal which is orthogonal to the first output signal; one of the input signals to the first modulator may be zero; one of the input signals to the second modulator may be zero; another of the input signals to the first modulator may be orthogonal to another of the input signals to the second modulator; and the first and second carrier modulator signals may be coherent. The means for combining may comprise a quadrature splitter, a hybrid splitter, a branch line splitter, a Wilkinson combiner, a bridge circuit, a balun, a transformer or a directional coupler.

A combiner for selectively combining modulated signals in accordance with the invention includes a first modulator with a selective input which receives at least one input signal and a first carrier signal and which outputs a first output of a modulated first carrier signal; a second modulator with a selective input which receives at least one input signal and a second carrier signal and which outputs a second output of a modulated second carrier signal; a first power amplifier coupled to the first output for providing a first amplified output signal; a second power amplifier coupled to the second output for providing a second amplified output signal; an output combiner for combining the first and second amplified output signals to provide a combined output; and wherein the first and second carrier signals are selectably coherent or incoherent with the selection of first and second coherent carrier signals causing the combined output to comprise a single modulated carrier of higher power and the selection of first and second incoherent carrier signals causing the combined output to comprise two distinguishable carriers of lower power.

A method for selectively combining modulated signals in accordance with the invention includes providing a first modulator with a selective input which receives at least one input signal and a first carrier signal and which outputs a first output of a modulated first carrier signal; providing a second modulator with a selective input which receives at least one input signal and a second carrier signal and which outputs a second output of a modulated second carrier signal; providing a first power amplifier coupled to the first output for providing a first amplified output signal; providing a second power amplifier coupled to the second output for providing a second amplified output signal; combining the first and second amplified output signals to provide a combined output; and wherein the first and second carrier signals are selectably coherent or incoherent with the selection of first and second coherent carrier signals causing the combined output to comprise a single modulated carrier of higher power and the selection of first and second incoherent carrier signals causing the combined output to comprise two distinguishable carriers of lower power. The first modulator output may comprise first and second modulated output signals which are modulated with the first carrier signal with the first and second output signals being orthogonal; the second modulator output may comprise third and fourth modulated output signals which are modulated with the second carrier with the third and fourth modulated output signals being orthogonal; and the first and second carrier signals may be coherent. The first modulator output may comprise first and second modulated output signals which are modulated with the first carrier signal with the first and second modulated output signals being orthogonal; the second modulator output may comprise third and fourth modulated output signals which are modulated with the second carrier with the third and fourth modulated output signals being orthogonal; and the first and second modulator carrier signals may be coherent. The third output signal may be identical to the second signal and the fourth output signal may be an inversion of the first signal. The means for combining may introduce a phase shift so that a relative phase of components of the combined output signal is shifted relative to a phase of the first and second amplified output signals input thereto. The phase shift may be approximately 0°, approximately 90° or approximately 180°. The combiner may be part of a multicarrier transmitter or a base station transmitter. A transfer function of the quadrature splitter may comprise $$\text{hybrid\_90} := \begin{bmatrix} \frac{1}{2}\sqrt{2} \\ \frac{1}{2}j\sqrt{2} \end{bmatrix}$$

The first modulator output signal may comprise a first output signal; the second modulator output signal may comprise a second output signal which is orthogonal to the first output signal; one of the input signals to the first modulator may be zero; one of the input signals to the second modulator may be zero; another of the input signals to the first modulator may be orthogonal to another of the input signals to the second modulator; and the first and second carrier modulator signals may be coherent. The means for combining may comprise a quadrature splitter, a hybrid splitter, a branch line splitter, a Wilkinson combiner, a bridge circuit, a balun, a transformer or a directional coupler.

A combiner for combining modulated signals in accordance with the invention includes a first modulator which receives an input comprising a complex signal TX and a first carrier signal and which outputs a first output of first carrier signal modulated with the complex signal TX; a second modulator which receives an input comprising a complex signal −90°·TX and a second carrier signal and which outputs a second output of the second carrier signal modulated with the complex signal −90°·TX; a first power amplifier coupled to the first output for providing a first amplified output signal; a second power amplifier coupled to the second output for providing a second amplified output signal; means for combining the first and second amplified output signals to provide a combined output; and wherein the first and second carrier signals are coherent and the means for combining produces the combined output with a single carrier having a power based upon of the power of the first and second amplified output signals. A combiner apparatus in accordance with the invention may include a plurality of the above described combiner, and wherein each of the plurality of combiners produces an output signal which is combined by an output combiner comprising a first input and a second input with one of the inputs being phase shifted by a phase shift of approximately 90° relative to another of the inputs to produce a combined output comprising a single carrier having a power based on the power of the outputs of the plurality of combiners.

BRIEF DESCRIPTION OF THE DRAWINGS

Like reference numerals identify like parts throughout the drawings.

DESCRIPTION OF THE PREFERRED EMBODIMENTS

The present invention provides a combiner and a method for selectively combining modulated signals produced from either coherent or incoherent carriers. From a hardware perspective, the embodiments of FIGS. 2–7 of the present invention utilize hardware similar to that of the prior art of FIG. 1 except that the signal router 20' has been eliminated which provides substantial benefits including the ability to perform manipulations readily at baseband, less expense, smaller physical size, and less power consumption. With the invention, the selective changing of at least one input to first and second quadrature modulators or the application of a selected carrier signal to the first and second quadrature modulators results in the input of first and second carrier signals being selectively combined in the combined output as a single modulated carrier of higher power and therefore no longer having separately identifiable carriers or two distinguishable carriers of lower power. The selection of coherent carrier signals as inputs to the quadrature modulators causes the signals applied to quadrature splitter 24' to add on a voltage basis in phase thus providing a power increase with a single carrier frequency and the selection of incoherent carrier signals as inputs to the quadrature modulator causes the combined output to comprise two distinguishable carriers each of a reduced power. The choice of input signals, and selective inversion at baseband and one or a pair of carriers may be used as a control mechanism for controlling the combined output to be in phase or incoherent.

Moreover, the inputs to the first and second quadrature modulators, which use a single carrier, may be chosen to be a first complex signal TX and a second complex signal −90°·TX to produce a combined output of increased power.

The general case of a complex modulated carrier is conceptually described as follows. The $n^{th}$ signal is at frequency $\omega_n$ and the envelope is described by $S_n$. The fact that $s_n$ is a function of time is implicit but excluded for clarity. The signal $S_n$ is very slowly varying with respect to the carrier and is assumed constant during a carrier cycle. The carrier may be written as $$TX_n := S_n \cos(\omega_n t)$$

where the message itself is a complex envelope described as $$S_n := I_n + jQ_n$$

Figure 2:
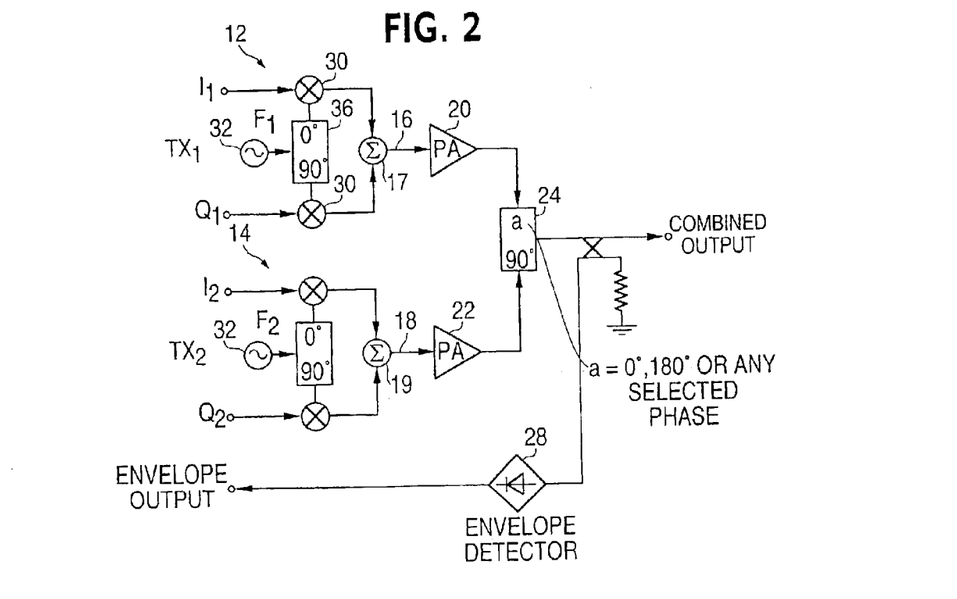
FIG. 2 illustrates noncoherent combining in accordance with the present invention.

FIG. 2 illustrates the use of the invention in which two incoherent carrier signals $F_1$ and $F_2$ are modulated by signals $I_1$, $Q_1$ and $I_2$, $Q_2$ respectively. Each output signal 16 and 18 is amplified separately with (nominally) identical power amplifiers 20 and 22. Each power amplifier 20 and 22 has preferably a nominal substantively identical power gain of Gp. The outputs are then combined with an output combiner 24' which may be of diverse designs dependent upon the power of the combined output, desired phase shift etc. The output combiner 24', as illustrated, does not shift the 0° input and introduces, an approximate 90° phase shift in the output from the 90° input. However, the output combiner 24', which produces the combined output, may operate to provide in-phase, complimentary phase (180°) or quadrature phase (90°) modulated carriers or carriers with other selective phase relationships relative to each other. Only quadrature phase amplified output signals are discussed as being produced by the output combiner 24' in the examples described below, but the relative phase shift between the inputs that is introduced by the power combiner may be determined by the design of the power combiner.

For an (nominally) ideal quadrature phase power combiner 24', the voltage transfer function may be written in complex matrix notation as $$\text{hybrid\_90} := \begin{bmatrix} \frac{1}{2}\sqrt{2} \\ \frac{1}{2}j\sqrt{2} \end{bmatrix}$$

In similar complex matrix notation, the inputs to a coupler consisting of two incoherent signals, can be written as:

$$\text{combiner\_in} := [\sqrt{Gp}(I_1+jQ_1)\cos(\omega_1 t), \sqrt{Gp}(I_2+jQ_2)\cos(\omega_2 t)]$$

The output of the output combiner 24' is determined by multiplying the input matrix by the quadrature combiner matrix which results in $$\text{combiner\_out\_nc} := $$
$$\frac{1}{2}\sqrt{Gp}(I_1+jQ_1)\cos(\omega_1 t)\sqrt{2} + \frac{1}{2}j\sqrt{Gp}(I_2+jQ_2)\cos(\omega_2 t)\sqrt{2}$$

As is apparent, the result is simply the sum of the two incoherent input signals.

Figure 3:
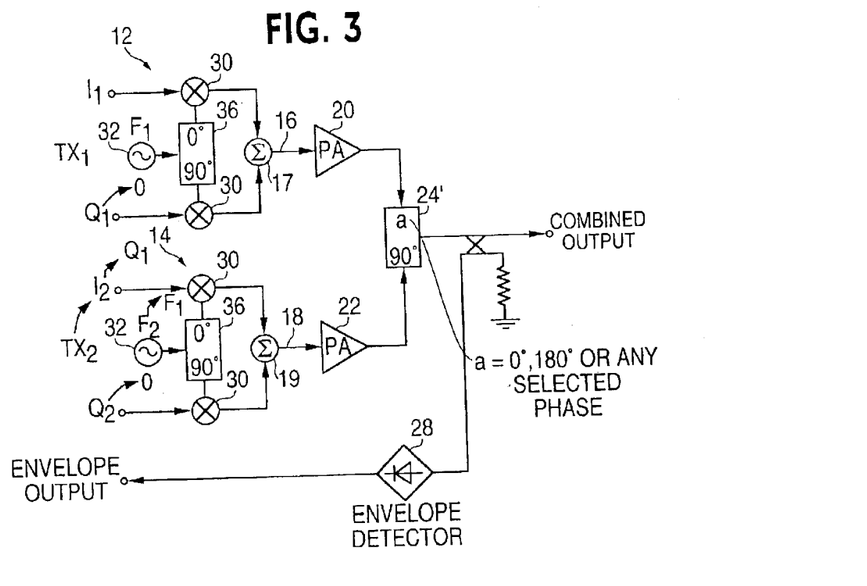
FIG. 3 illustrates a first form of coherent combining in accordance with the present invention.

FIG. 3 illustrates a first use of the invention in which coherent carrier signals $F_1$ are modulated with $I_1$ and $Q_1$ and combined to produce a combined output of a single carrier with a power equal to the sum of the power produced by the individual power amplifiers 20 and 22. If two coherent carrier signals $F_1$ are respectively modulated with input signals $I_1$, $Q_1$ and $I_2$, $Q_2$, the two signals, $F_1$ as illustrated are coherent and (nominally) identical. In this case the input matrix is $$\text{combiner\_in} := [\sqrt{Gp}(I_1+jQ_1)\cos(\omega_1 t), \sqrt{Gp}(I_1+jQ_1)\cos(\omega_1 t)]$$

which, after combining in the 90 degree hybrid, results in:

$$\text{combiner\_out\_cl} := \frac{1}{2}\sqrt{Gp}\cos(\omega_1 t)\sqrt{2}(I_1+jQ_1+jI_1-Q_1)$$

Clearly, this result is a corrupted version of the original envelope so direct application of identical signals does not combine properly.

However, by suppressing the Q inputs in both paths and then applying the $Q_1$ signal normally input to the first path to the $I_2$ input of the second path, the result is a replication of the original message. The mechanism for performing the manipulations of the inputs to the quadrature modulators may be performed by diverse switching or processing techniques of known designs which are not described herein since they are not part of the invention.

Suppressing the Q input in path 1 results in $$TX_1 := \sqrt{Gp}I_1\cos(\omega_1 t)$$

and suppressing the Q input in path 2 and deriving the I input of path 2 from the Q signal of path 1 results in $$TX_2 := \sqrt{Gp}Q_1\cos(\omega_1 t)$$

Hence, the input signal matrix is $$\text{combiner\_in} := [\sqrt{Gp}I_1\cos(\omega_1 t), \sqrt{Gp}Q_1\cos(\omega_1 t)]$$

and the resulting signal after combining in the quadrature hybrid becomes $$\text{combiner\_out\_c} := \frac{1}{2}\sqrt{Gp}(I_1+jQ_1)\cos(\omega_1 t)\sqrt{2}$$

The result is a replication of the original signal envelope. While the result of this method is what is desired and is mathematically correct, there is a practical drawback.

In practice, the I signal and the Q signal can be very different at a given instant in time. Thus, the power amplifiers 20 and 22 are usually at a different level of compression in one of the paths versus the other. This could result in an amplitude and phase distortion in the combined output because each path undergoes a different amount of AM=>AM and AM=>PM distortion. The net result is degradation in both EVM and the spectral mask.

Alternatively, the I Inputs are suppressed in both paths and then the $I_1$ signal normally input to the first path is applied to the $Q_2$ input of the second path to replicate the original message.

Figure 4:
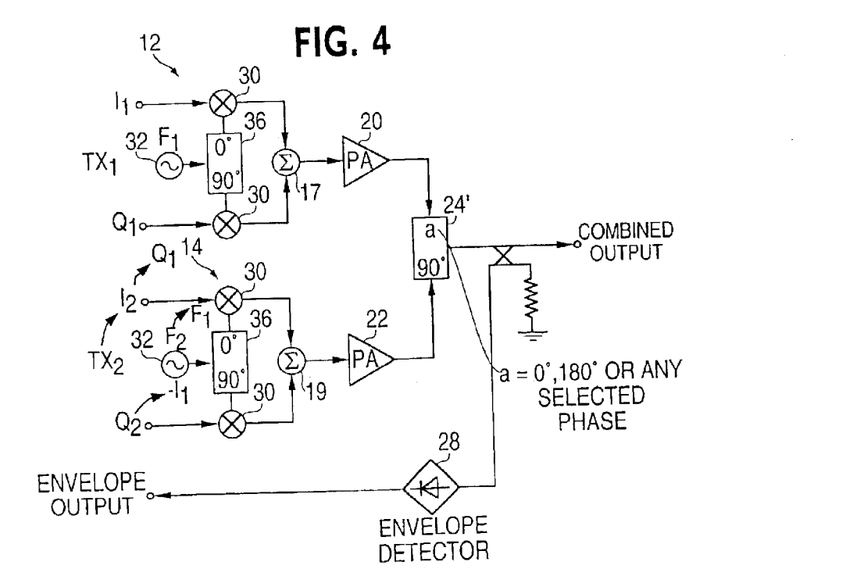
FIG. 4 illustrates a second form of coherent combining in accordance with the present invention.

FIG. 4 illustrates a second use of the invention in which coherent carrier signals $F_1$ are modulated with signals $I_1$ and $Q_1$ which are switched from normal input and algebraically manipulated so that an inversion of one of the input signals to the first quadrature modulator 12 is applied to the second quadrature modulator 14 along with another of the first input signals to the first quadrature modulator in a noninverted form. The mechanism for performing the input manipulations to the quadrature modulations 12 and 14 may be performed by diverse switching, processing and inversion techniques of known designs which are not described herein since they are not part of the invention. This alternate method drives each power amplifier 20 and 22 with nominally identical signals. This ensures that both power amplifiers 20 and 22 apply equal distortion to the input signal. By applying the Q signal from the first path to the I input of the second path and an inversion of the I signal from the first path to the Q input of the second path to the quadrature splitter 36 in the quadrature modulator 14, a 90° phase change results. Combined with the 90 degree phase shift in the output combiner 24', the voltage vectors add coherently.

The first input is $$TX_1 := \sqrt{Gp}(I_1+jQ_1)\cos(\omega_1 t)$$

and the second input is formed by feeding I from the Q input of the first path and feeding the Q input with a −I input of the first path which results in:

$$TX_2 := \sqrt{Gp}(Q_1-jI_1)\cos(\omega_1 t)$$

It should be noted that the instantaneous power of the envelope is the same for both paths and is $I_1^2+Q_1^2$ thus ensuring near equal distortion in both of the paths.

The input matrix then becomes $$\text{combiner\_in} := [\sqrt{Gp}(I_1+jQ_1)\cos(\omega_1 t), \sqrt{Gp}(Q_1-jI_1)\cos(\omega_1 t)]$$

and after combining the result is $$\text{combiner\_out\_c2} := \sqrt{Gp}(I_1+jQ_1)\cos(\omega_1 t)\sqrt{2}$$

In this case it is evident that the baseband portion of the signal is once again replicated after combining.

Alternatively, the $F_2$ carrier may be applied to the quadrature modulator 12 and 14, $-I_2$ to the $Q_1$ input and the $Q_2$ input to the $I_1$ input.

It should also be recognized that less than perfect combining may be accommodated for in the baseband signal by amplitude imbalance corrected by scaling one I/Q input relative to the other and phase imbalance by adding appropriately determined DC offsets to one of the I/Q pairs.

The output combiner 24' functions as a means for combining the first and second amplified output signals to provide a combined output. The output combiner 24' may be an analog or a digital design and may be a circuit. The various types of output combiners are exemplified without limitation by a quadrature splitter, a hybrid coupler, a branch line splitter, a Wilkinson combiner, a bridge circuit, a balun, a transformer, or a directional coupler. Moreover, as indicated in FIGS. 2–4, the relative phase shift applied by the output combiner 24' is subject to choice of any desired relative phase shift and is, for example, without limitation, 0°, 90° and 180°.

Further, the invention is applicable to coherent applications involving multiple carriers. The results are somewhat more complex in the general case of N-carriers. But, if the number of carriers is constrained to $2^N$ where N is an integer, then the symmetry of the problem simplifies the result. It can be seen that this represents pairs of pairs of carriers and is a logical extension of the examples above of N being equal to 2 as described below in conjunction with FIG. 5. It should be noted that the two paths into every quadrature combiner are orthogonal and at the same frequency in order to combine coherently. Thus, the set of baseband inputs can be deduced recursively. This is illustrated in FIGS. 5–7.

Figure 5:
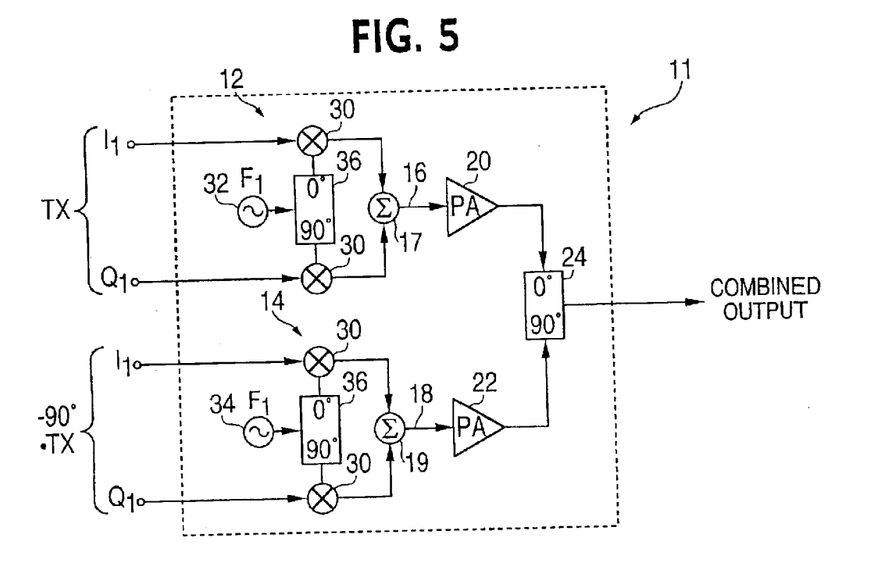
FIG. 5 illustrates a third form of coherent combining in accordance with the invention.

FIG. 5 illustrates a modular construction 11 which may be used to provide a coherent combined output when the number of inputs is equal to four. The modular construction 11 is used as a building block in the embodiments 11' and 11" of FIGS. 6 and 7 where the number of inputs respectively equal to 8 and 16. The symbol TX identifies a pair of I and Q signals designated $I_1$ and $Q_1$ which are orthogonal to each other and represent a complex number when summed. The symbol $-90°\cdot TX$ represents another pair of I and Q signals $I_2$ and $Q_2$ which are also orthogonal to each other and represent a complex number when summed. The complex signal quantity TX equals $-90°TX$. The sum $I_1$ and $Q_1$, is equal to the sum of $I_2$ and $Q_2$ shifted by a $-90°$. As a result, a pair of coherent output signals 16 and 18 are produced by the respective quadrature modulators 12 and 14. The combined output produced by output combiner 24' is a single carrier having increased power equal to the sum of the outputs produced by the individual power amplifiers 20 and 22.

Figure 6:
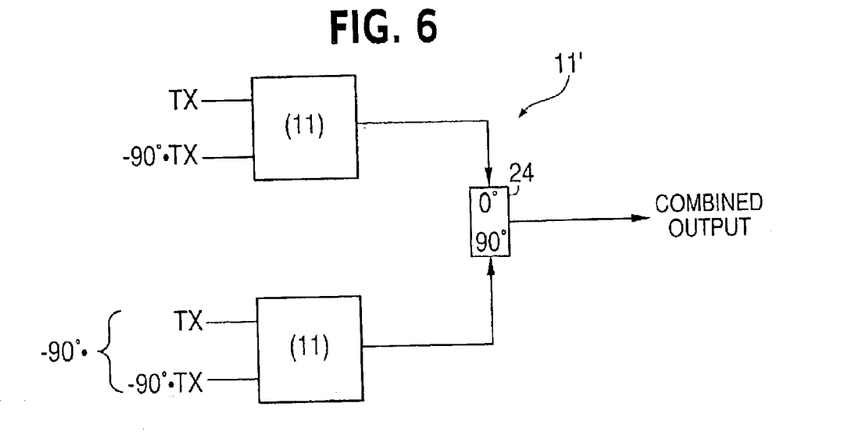
FIG. 6 illustrates a fourth form of coherent combining in accordance with the invention.

FIG. 6 illustrates a modular construction 11' which is configured with a pair of modules 11 as described above in FIG. 5 with the appropriate $-90°$ phase shifts as illustrated. A $-90°$ phase shift is applied to a single TX input of each of the inputs of modules 11 and further, an overall $-90°$ phase shift is applied to the combined inputs of one of the modules 11. A combined output with a single carrier having increased power equal to the sum of the outputs produced by the individual power amplifiers 20 and 22 is produced.

Figure 7:
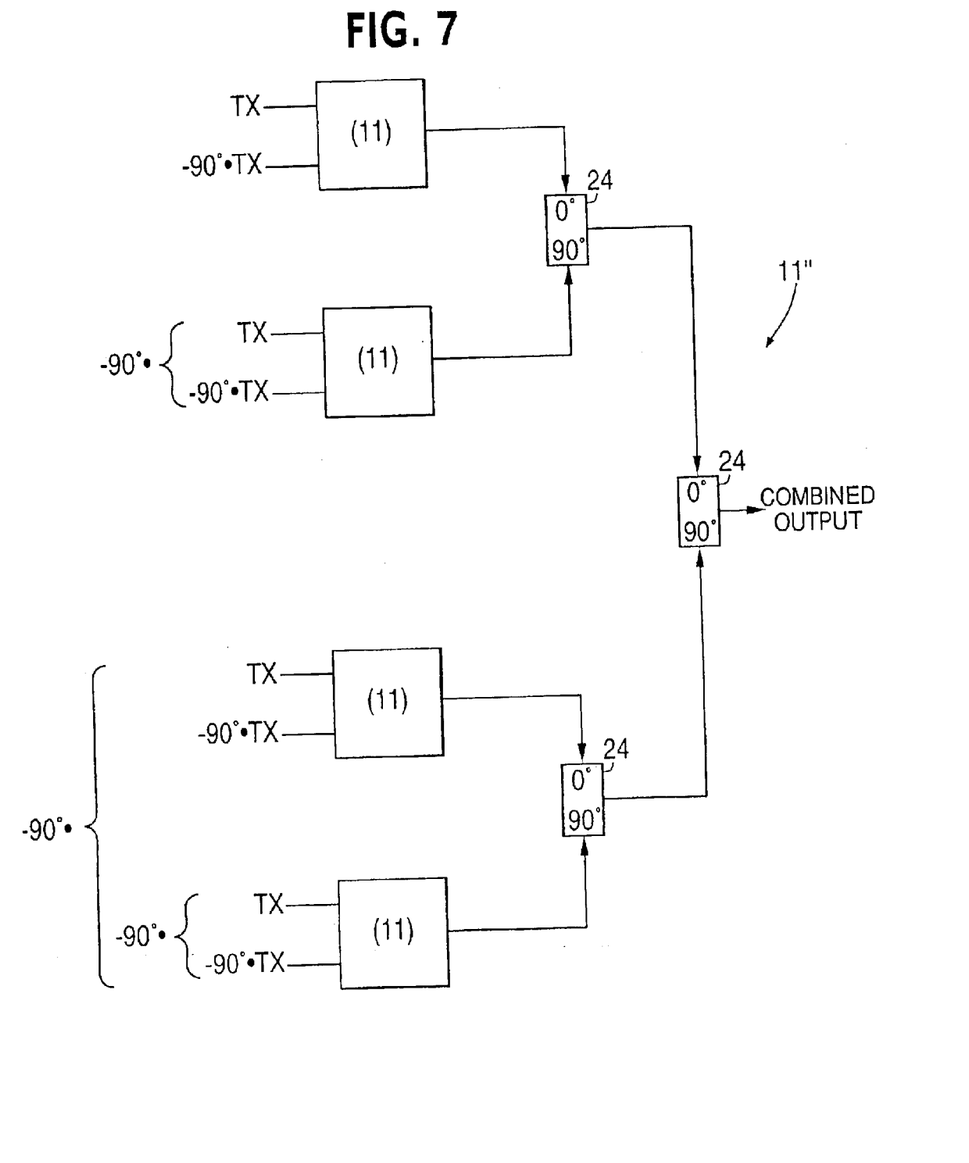
FIG. 7 illustrates a fifth form of coherent combining in accordance with the invention.

FIG. 7 illustrates a third embodiment 11" which is configured with four modules 11 of FIG. 5. As is seen a $-90°$ phase shift is applied to three of the four TX inputs to the modules 11, a pair of $-90°$ phase shifts is applied to a pair of inputs to two of the modules 11 and finally, an overall $-90°$ phase shift is applied to four of the inputs of a pair of two of the modules 11. A combined output with a single carrier having increased power equal to the sum of the outputs produced by the individual power amplifiers 20 and 22 is produced.

The overall power of the combined output of the embodiments 11, 11' and 11" is equal to the sum of the power produced by the individual power amplifiers 20 and 22 in each module 11.

The modular construction of FIGS. 6 and 7 may be extended to higher numbers of inputs than 16 with the overall output power being equal to the sum of the output power produced by each of the power amplifiers 20 and 22 in each module 11. Other combinations are possible, such as 8 sets of inputs to create one carrier at 8 times the power or 2 carriers at 4 times the power or 4 carriers at 2 times the power.

A classic application of the invention is in a BTS (Base Transceiver Station) for field deployment. When offered traffic and user density is low, few channels (i.e. carriers) are needed and it is advantageous to cover the maximum area possible by utilized a single high carrier power. This scenario is addressed exactly through use of the coherent combining mode. Conversely, when user density is high it is likely that more carriers are needed at the expense of lower power. The latter may be quite acceptable because in many cases directional antennas are used to mitigate interference and in providing directivity gain is achieved. The invention presented herein allows a BTS to be configured in either a coherent or a noncoherent mode on a user programmable and dynamic basis thus aiding initial deployment and any subsequent redeployment of a BTS asset. It also allows for remote reconfiguration.

While the invention has been described in terms of its preferred embodiments, it should be understood that numerous modifications may be made thereto without departing from the spirit and scope of the present invention. It is intended that all such modifications fall within scope of the appended claims.

What is claimed is:

1. A combiner for selectively combining modulated signals comprising:

a first modulator with an input which receives at least one input signal and a first carrier signal and which outputs a first output of a modulated first carrier signal;

a second modulator with an input which receives at least one input signal and a second carrier signal and which outputs a second output of a modulated second carrier signal;

a first power amplifier coupled to the first output for providing a first amplified output signal;

a second power amplifier coupled to the second output for providing a second amplified output signal;

means for combining the first and second amplified output signals to provide a combined output power from input of first and second coherent carrier signals to be of a higher power and a combined output power from input of incoherent carrier signals to comprise two distinguishable carriers of lower power.

2. A combiner in accordance with claim 1 wherein:

the first modulator output comprises first and second modulated output signals which are modulated with the first carrier signal with the first and second modulated output signals being orthogonal;

the second modulator output comprises third and fourth modulated output signals which are modulated with the second carrier with the third and fourth output signals being orthogonal; and the first and second modulator carrier signals are incoherent.

3. A combiner in accordance with claim 1 wherein:

the first modulator output comprises first and second modulated output signals which are modulated with the first carrier signal with the first and second modulated output signals being orthogonal;

the second modulator output comprises third and fourth modulated output signals which are modulated with the second carrier with the third and fourth modulated output signals being orthogonal; and the first and second modulator carrier signals are coherent.

4. A combiner in accordance with claim 3 wherein:

the third output signal is identical to the second signal and the fourth output signal is an inversion of the first signal.

5. A combiner in accordance with claim 2 wherein:

the means for combining introduces a phase shift so that a relative phase of components of the combined output signal is shifted relative to a phase of the first and second amplified output signals input thereto.

6. A combiner in accordance with claim 5 wherein:

the phase shift is approximately 90°.

7. A combiner in accordance with claim 5 wherein:

the phase shift is approximately 180°.

8. A combiner in accordance with claim 5 wherein:

the phase shift is approximately zero degrees.

9. A combiner in accordance with claim 1 wherein:

the combiner is part of a multicarrier transmitter.

10. A combiner in accordance with claim 2 wherein:

the combiner is part of a multicarrier transmitter.

11. A combiner in accordance with claim 3 wherein:

the combiner is part of a multicarrier transmitter.

12. A combiner in accordance with claim 4 wherein:

the combiner is part of a multicarrier transmitter.

13. A combiner in accordance with claim 5 wherein:

the combiner is part of a multicarrier transmitter.

14. A combiner in accordance with claim 6 wherein:

the combiner is part of a multicarrier transmitter.

15. A combiner in accordance with claim 7 wherein:

the combiner is part of a multicarrier transmitter.

16. A combiner in accordance with claim 9 wherein:

the transmitter is a base station transmitter.

17. A combiner in accordance with claim 1 wherein:

the means for combining comprises a quadrature splitter.

18. A combiner in accordance with claim 1 wherein:

the means for combining comprises a hybrid coupler.

19. A combiner in accordance with claim 1 wherein:

the means for combining comprises a branch line splitter.

20. A combiner in accordance with claim 1 wherein:

the means for combining comprises a Wilkinson combiner.

21. A combiner in accordance with claim 1 wherein:

the means for combining comprises a bridge circuit.

22. A combiner in accordance with claim 1 wherein:

the means for combining comprises a balun.

23. A combiner in accordance with claim 1 wherein:

the means for combining comprises a transformer.

24. A combiner in accordance with claim 1 wherein:

the means for combining comprises a directional coupler.

25. A combiner in accordance with claim 16 wherein a transfer function of an ideal quadrature splitter comprises:

$$\text{hybrid\_90} := \begin{bmatrix} \frac{1}{2}\sqrt{2} \\ \frac{1}{2}j\sqrt{2} \end{bmatrix}.$$

26. A combiner in accordance with claim 1 wherein:

the first modulator output signal comprises a first output signal;

the second modulator output signal comprises a second output signal which is orthogonal to the first output signal;

one of the input signals to the first modulator is zero;

one of the input signals to the second modulator is zero;

another of the input signals to the first modulator is orthogonal to another of the input signals to the second modulator; and the first and second carrier modulator signals are coherent.

27. A combiner in accordance with claim 26 wherein:

the means for combining introduces a phase shift so that a relative phase of components of the combined output signal is shifted relative to a phase of the first and second amplified output signals input thereto.

28. A combiner in accordance with claim 27 wherein:

the phase shift is approximately 90°.

29. A combiner in accordance with claim 27 wherein:

the phase shift is approximately 180°.

30. A combiner in accordance with claim 27 wherein:

the phase shift is approximately 0 degrees.

31. A combiner in accordance with claim 26 wherein:

the combiner is part of a multicarrier transmitter.

32. A combiner in accordance with claim 26 wherein:

the transmitter is a base station transmitter.

33. A combiner in accordance with claim 26 wherein:

the means for combining comprises a quadrature splitter.

34. A combiner in accordance with claim 26 wherein:

the means for combining comprises a hybrid coupler.

35. A combiner in accordance with claim 26 wherein:

the means for combining comprises a branch line splitter.

36. A combiner in accordance with claim 26 wherein:

the means for combining comprises a directional coupler.

37. A combiner in accordance with claim 26 wherein:

the means for combining comprises a Wilkinson combiner.

38. A combiner in accordance with claim 26 wherein:

the means for combining comprises a bridge circuit.

39. A combiner in accordance with claim 26 wherein:

the means for combining comprises a balun.

40. A combiner in accordance with claim 26 wherein:

the means for combining comprises a transformer.

41. A combiner in accordance with claim 33 wherein the transfer function of the quadrature splitter comprises:

$$\text{hybrid\_90} := \begin{bmatrix} \frac{1}{2}\sqrt{2} \\ \frac{1}{2}j\sqrt{2} \end{bmatrix}.$$

42. A combiner for selectively combining modulated signals comprising:

a first modulator with an input which receives at least one input signal and a first carrier signal and which outputs a first output of a modulated first carrier signal;

a second modulator with an input which receives at least one input signal and a second carrier signal and which outputs a second output of a modulated second carrier signal;

a first power amplifier coupled to the first output for providing a first amplified output signal;

a second power amplifier coupled to the second output for providing a second amplified output signal;

an output combiner for combining the first and second amplified output signals to provide a combined output power from input of first and second coherent carrier signals to be of a higher power and a combined output power from input of incoherent carrier signals to comprise two distinguishable carriers of lower power.

43. A method for selectively combining modulated signals comprising:

providing a first modulator with a selective input which receives at least one input signal and a first carrier signal and which outputs a first output of a modulated first carrier signal;

providing a second modulator with a selective input which receives at least one input signal and a second carrier signal and which outputs a second output of a modulated second carrier signal;

providing a first power amplifier coupled to the first output for providing a first amplified output signal;

providing a second power amplifier coupled to the second output for providing a second amplified output signal;

combining the first and second amplified output signals to provide a combined output; and wherein the first and second carrier signals are selectably coherent or incoherent with the selection of first and second coherent carrier signals causing the combined output to comprise a single modulated carrier of higher power and the selection of first and second incoherent carrier signals causing the combined output to comprise two distinguishable carriers of lower power.

44. A method in accordance with claim 43 wherein:

the first modulator output comprises first and second modulated output signals which are modulated with the first carrier signal with the first and second modulated output signals being orthogonal;

the second modulator output comprises third and fourth modulated output signals which are modulated with the second carrier with the third and fourth modulated output signals being orthogonal; and the first and second modulator carrier signals are incoherent.

45. A method in accordance with claim 43 wherein:

the first modulator output comprises first and second modulated output signals which are modulated with the first carrier signal with the first and second output modulated signals being orthogonal;

the second modulator output comprises third and fourth modulated output signals which are modulated with the second carrier with the third and fourth modulated output signals being orthogonal; and the first and second modulator carrier signals are coherent.

46. A method in accordance with claim 45 wherein:

the third output signal is identical to the second signal and the fourth output signal is an inversion of the first signal.

47. A method in accordance with claim 44 wherein:

introducing a phase shift so that a relative phase of components of the combined output signal is shifted relative to a phase of the first and second amplified output signals input thereto.

48. A method in accordance with claim 47 wherein:

the phase shift is approximately 90°.

49. A combiner in accordance with claim 47 wherein:

the phase shift is approximately 180°.

50. A method in accordance with claim 43 wherein:

the first modulator output signal comprises a first output signal;

the second modulator output signal comprises a second output signal which is orthogonal to the first output signal;

one of the input signals to the first modulator is zero;

one of the input signals to the second modulator is zero;

another of the input signals to the first modulator is orthogonal to another of the input signals to the second modulator; and the first and second carrier modulator signals are coherent.

51. A combiner in accordance with claim 41 wherein:

a phase shift is introduced so that a relative phase of components of the combined output signal is shifted relative to a phase of the first and second amplified output signals input thereto.

52. A method in accordance with claim 51 wherein:

the phase shift is approximately 90°.

53. A method in accordance with claim 51 wherein:

the phase shift is approximately 180°.

54. A combiner for combining modulated signals comprising:

a first modulator which receives an input comprising a complex signal TX and a first carrier signal and which outputs a first output of first carrier signal modulated with the complex signal TX;

a second modulator which receives an input comprising a complex signal −90°·TX and a second carrier signal and which outputs a second output of the second carrier signal modulated with the complex signal −90°·TX;

a first power amplifier coupled to the first output for providing a first amplified output signal;

a second power amplifier coupled to the second output for providing a second amplified output signal;

means for combining the first and second amplified output signals to provide a combined output; and wherein the first and second carrier signals are coherent and the means for combining produces the combined output with a single carrier having a power based upon of the power of the first and second amplified output signals.

55. A combiner apparatus comprising:

a plurality of combiners in accordance with claim 54; and wherein each of the plurality of combiners produces an output signal which is combined by an output combiner comprising a first input and a second input with one of the inputs being phase shifted by a phase shift of approximately 90° relative to another of the inputs to produce a combined output comprising a single carrier having a power based on the power of the outputs of the plurality of combiners.

* * * * *